United States Patent
Scorsone et al.

(10) Patent No.: US 8,703,250 B2
(45) Date of Patent: Apr. 22, 2014

(54) METHOD FOR MANUFACTURING A POROUS SYNTHETIC DIAMOND MATERIAL

(75) Inventors: Emmanuel Scorsone, Magny les Hameaux (FR); Hugues Girard, Viroflay (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 13/639,841

(22) PCT Filed: Apr. 5, 2011

(86) PCT No.: PCT/EP2011/055263
§ 371 (c)(1),
(2), (4) Date: Nov. 8, 2012

(87) PCT Pub. No.: WO2011/124568
PCT Pub. Date: Oct. 13, 2011

(65) Prior Publication Data
US 2013/0156974 A1 Jun. 20, 2013

(30) Foreign Application Priority Data

Apr. 7, 2010 (FR) .................................... 10 52613

(51) Int. Cl.
*C23C 16/27* (2006.01)
*H05H 1/24* (2006.01)

(52) U.S. Cl.
USPC ........................................ 427/577; 427/249.8

(58) Field of Classification Search
USPC .............................. 427/569, 577, 249.1, 249.8
See application file for complete search history.

(56) References Cited

U.S. PATENT DOCUMENTS

| | | | |
|---|---|---|---|
| 4,738,689 A * | 4/1988 | Gigl et al. ....................... | 51/295 |
| 5,885,541 A * | 3/1999 | Bates ............................... | 423/446 |
| 6,255,712 B1 * | 7/2001 | Clevenger et al. ............. | 257/522 |
| 6,346,484 B1 * | 2/2002 | Cotte et al. ..................... | 438/725 |
| 6,749,931 B1 | 6/2004 | Pinneo et al. | |
| 2005/0277303 A1 | 12/2005 | Ravi et al. | |
| 2009/0127136 A1 | 5/2009 | Davies et al. | |
| 2011/0073380 A1 * | 3/2011 | DiGiovanni ................... | 175/432 |

FOREIGN PATENT DOCUMENTS

WO WO 2010/010176 A1 * 1/2010

OTHER PUBLICATIONS

Arora, S.K., et al., "Growth and field emission characteristics of diamond films on macroporous silicon substrate". Journal of Applied Physics 104, 103524 (2008) pp. 1-8.*
Kurdyukov, D.A., et al., "Ordered porous diamond films fabricated by colloidal crystal templating". Nanotechnology 23 (2012) 015601 pp. 1-8.*
Baranauskas, Vitor et al., "Method of Porous Diamond Deposition on Porous Silicon", Applied Surface Science, vol. 185. pp. 108-113, Dec. 2001.
Kondo, Takeshi et al., "Conductive Diamond Hollow Fiber Membranes", Electrochemistry Communications, vol. 11, pp. 1668-1691, Aug. 2009.
Nebel, C.E et al., "Diamond Nano-Wires, a New Approach Towards Next Generation Electrochemical Gene Sensor Platforms", Diamond & Related Materials, vol. 18, pp. 910-917, May-Aug. 2009.
Sakaue, Hiroyuki et al., "Low Dielectric Constant Porous Diamond Films Formed by Diamond Nanoparticles", Applied Physics Letters. vol. 83. No. 11, pp. 2226-2228, Sep. 15, 2003.
International Search Report and Written Opinion for International Application No. PCT/EP2011/055263, mailed Jul. 4, 2011.

* cited by examiner

*Primary Examiner* — Bret Chen
(74) *Attorney, Agent, or Firm* — Nixon Peabody LLP

(57) ABSTRACT

A method of manufacturing a diamond layer having a porous three-dimensional structure, the method being of the type which includes growing the diamond layer from a sacrificial material and gradually decomposing said sacrificial material during growth of the diamond layer, said material including the following steps; 1) provision of a substrate capable of supporting the plasma-enhanced chemical vapor deposition growth of the diamond layer on at least one of the surfaces of the substrate, the substrate comprising, on said at least one surface thereof, a layer made of a sacrificial material having a porous three-dimensional structure capable of gradually decomposing upon contact with said plasma, the layer of sacrificial material containing diamond grains of nanometric size, and 2) growth by plasma-enhanced chemical vapor deposition of the diamond layer from diamond grains and concomitant and gradual decomposition of the sacrificial material upon contact with said plasma.

9 Claims, 1 Drawing Sheet

METHOD FOR MANUFACTURING A POROUS SYNTHETIC DIAMOND MATERIAL

CROSS REFERENCE TO RELATED APPLICATIONS OR PRIORITY CLAIM

This application is a National Phase of PCT/EP2011/055263, filed Apr. 5, 2011, entitled, "METHOD FOR MANUFACTURING A POROUS SYNTHETIC DIAMOND MATERIAL", which claims the benefit of French Patent Application No. 10 52613, file Apr. 7, 2010, the contents of which are incorporated herein by reference in their entirety.

TECHNICAL FIELD

The invention relates to a method that makes it possible to manufacture a porous synthetic diamond material, preferably uniquely constituted of synthetic diamond.

PRIOR ART

Diamond is a particularly interesting material because it has exceptional mechanical, electrical, thermal and optical properties and is of a unique character compared to other known materials.

It may be used in numerous fields; it may for example be used in microelectronics for the production of microsystems and integrated circuits, because it is an excellent dielectric material, or instead in chemistry for the manufacture of electrodes used for chemical detection.

Furthermore, diamond is also a material that is chemically and biologically inert and it is thus the subject matter of much scientific research in the medical field and more particularly in the field of implants and neuronal interrogation.

Finally, it is a material that has excellent electrochemical properties. In fact, diamond, which is an electrical insulator when it is intrinsic, becomes a conductor when it is doped with impurities. Thus, it is possible to produce doped diamond electrodes that have a large potential window (around 3 volts), a high resistance to corrosion and a high mechanical strength compared to other materials generally used in electrochemistry, as well as a low background current.

The growth of synthetic diamond is generally carried out in a CVD (Chemical Vapour Deposition) growth reactor by chemical deposition from a plasma enhanced vapour phase (the plasma being able to be created by using an energy source such as micro-waves (MPCVD), radio-frequencies (RFCVD) or a hot filament (HFCVD)). The vapour phase comprises hydrogen and a source of carbon, for example methane, and the deposition is carried out on a substrate that is prepared beforehand to initiate the growth of the diamond.

The preparation of the substrate may consist in depositing on the surface of the substrate diamond grains of nanometric size, which are going to grow during the step of CVD growth until a continuous film of diamond is obtained.

Another method of preparing the substrate consists in scratching the surface of the substrate so that the defects thereby created on the surface constitute nucleation sources enabling the formation of diamond grains of nanometric size that are going to grow until a continuous film of diamond is obtained.

The films of diamond thereby obtained generally have a columnar polycrystalline or nanocrystalline form as a function of the growth conditions. The diamond films obtained are thus very compact and have zero or virtually zero porosity.

Thus, the available diamond surfaces are limited to the almost flat upper face of the substrate or to both the upper face and the lower face of the substrate after separation of the diamond film from its substrate support in the particular cases where the diamond film is sufficiently thick to be self-supporting.

For numerous applications, it is however necessary to have a very large available diamond surface area. This is for example the case in electrochemistry, where the reactivity of the electrode depends on its active surface.

One way of increasing the active surface of the diamond consists in etching the diamond layer on the surface so as to increase the surface roughness thereof. Said method is for example used to manufacture biosensors by grafting strands of DNA on diamond nanowires (see the document [1] referenced at the end of this description). A film of diamond having a two-dimensional porosity (in other words uniquely a surface porosity) is thereby obtained.

Another known method makes it possible to obtain layers based on diamond having a very rough surface and having a three-dimensional porosity. Said method consists in making the diamond grow by carrying out a conventional CVD on a support that already has the three-dimensional geometry that it is wished to give to the diamond (see for example the document [2], where the support is porous silicon, and the document [3], where the support is a silicon carbide foam). A material known as "hybrid" or "composite" since it is composed both of diamond and the support material is then obtained.

This method has the advantage that the composite or hybrid diamond is easy to produce. However, certain properties of said composite materials are degraded compared to solid diamond materials, such as for example their mechanical strength.

Another method of making a three-dimensional diamond material consists in using glass fibres as support for the growth of the diamond (see the document [4]). After the growth of the diamond, the fibres are etched in a hydrofluoric acid based solution and a porous three-dimensional diamond structure in the form of an entanglement of diamond tubes is obtained.

However, this technique is based on the handling of glass fibre based filters acting as support during the growth of the diamond. Yet, after the etching of the glass fibre support, a self-supporting film is obtained which is very fragile and which needs to be consolidated by being adhered to a support. The drawback is that this transfer step is particularly difficult to perform by those skilled in the art.

Furthermore, the use of such a material to manufacture small objects, for example objects of micrometric size, is excluded by the difficulty of handling it. For example, the production of microelectrodes, which requires the deposition and the placing in contact of the porous diamond on a metal support of micrometric size, is compromised.

Other methods enabling a porous diamond to be obtained have been described in the literature.

For example, one of said methods consists in depositing diamond grains of nanometric size on a support, then connecting the grains together using hexachlorodisiloxane to form strong chemical bonds between the adjacent grains (see the document [5]).

A major drawback of said cluster of grains is that the surface termination of the diamond cannot be modified, because the grains would then be separated from each other during the surface modification.

However, it is interesting to be able to modify the surface of the diamond, for example by oxidising it to improve its wettability, or by electrochemically grafting active molecules for performing chemical or biological detection.

In addition, although the grains are attached to each other by strong bonds, the latter are weaker than the sp3 bonds of the diamond. Said assembly, formed of a cluster of grains, will thus be less robust than a diamond material constituted mainly of sp3 carbon bonds.

Another method consists in introducing a proportion of carbon in sp2 hybridisation state into a non porous diamond layer, for example by ion implant, then etching the sp2 carbons in a hydrogen plasma (see the document [6]).

However, since the implantation only takes place at the surface of the diamond layer, it is necessary to carry out several successive cycles of implant/etching until the desired thickness of porous diamond film is obtained. This method is thus relatively long.

Porous diamond can also be manufactured by heating to very high temperature (1150° C.) and to high pressure (5 Gpa) a mass of diamond grains arranged on a substrate (see the document [7]). In this case, the size of the pores and the porosity of the diamond layer may be modified by mixing a diluent with the mass of diamond grains before carrying out the heating. However this method can only be applied when the substrate is able to withstand the operating conditions (temperature and pressure).

Finally, it is possible to make a mass of diamond grains grow by CVD using the method known as photo-fragmentation of vapour phase fullerene (see the document [8]). To do this, fullerene vapours are introduced into the CVD growth reactor and diffuse into the pores of the mass of diamond grains. When the molecules of fullerene are strongly illuminated by a laser beam, they decompose and constitute a source of carbon enabling the growth of the diamond in the pores and a fixation of the grains together. This method, once again, can only apply if the substrate is able to withstand the operating conditions.

The inventor has thus set himself the aim of overcoming at least partially the aforementioned problems relative to the embodiments of the prior art by conceiving a method for manufacturing a diamond material that is entirely porous, which is easy to carry out and which is, preferably, uniquely constituted of diamond.

DESCRIPTION OF THE INVENTION

This aim is attained thanks to a method for manufacturing a diamond layer having a porous three-dimensional structure, the method being of the type which includes growing the diamond layer from a sacrificial material and gradually decomposing said sacrificial material during growth of the diamond layer, said method including the following steps:

1) provision of a substrate capable of supporting the growth by plasma enhanced chemical vapour deposition (CVD) of the diamond layer on at least one of the faces of the substrate, the substrate comprising on said at least one face a layer made of a sacrificial material having a porous three-dimensional structure and being capable of decomposing progressively upon contact with said plasma, the layer of sacrificial material containing diamond grains of nanometric size;

2) growth by plasma-enhanced chemical vapour deposition of the diamond layer from diamond grains and concomitant and gradual decomposition of the sacrificial material upon contact with said plasma.

It is pointed out that when it is said that the decomposition is "concomitant", this signifies that the decomposition and the growth take place at the same time, but does not signify that they necessarily start and end at the same instants.

In what precedes and what follows, the term "size", applied to grains or to pores, designates the largest dimension of said grains or said pores, and the term "nanometric" signifies greater than or equal to 1 nanometer and less than 1000 nanometers.

It will moreover be recalled that the term "grains" designates particles in which the ratio of the largest dimension over the smallest dimension is less than or equal to 5. The grains may thus be spherical or quasi-spherical, cubic or quasi-cubic, rhombohedral or quasi-rhombohedral, etc.

Hereafter, the term "diamond nano-powder" could be used instead of the expression "diamond powder in which the grains are of nanometric size", it being understood that "nano-powder" designates a series of grains, the largest dimension of which is greater than or equal to 1 nanometer and less than 1000 nanometers.

Preferably, the growth of the diamond layer is stopped when both the decomposition of the sacrificial material is complete (the sacrificial material has completely disappeared) and when the layer of diamond material has a desired porosity.

Advantageously, the decomposition of the sacrificial material comprises the etching of the sacrificial material by the plasma.

According to the method of the invention, diamond powder, the grains of which are of nanometric size, is incorporated in a sacrificial material having a porous three-dimensional structure and the assembly formed by the sacrificial material comprising the diamond grains is supported by a substrate. The sacrificial material is chosen so that it has the property of decomposing slowly (preferably by etching) in the diamond growth plasma. Preferably, the growth of the diamond is continued (thus implying the presence of the plasma) up to the complete disappearance of the sacrificial material at the end of the CVD growth of the diamond. Thus, during the growth of the diamond, the sacrificial material disappears progressively, revealing on the substrate a diamond layer having a porous three-dimensional structure.

It should be noted that when it is said that the sacrificial material and the diamond have a porous three-dimensional structure, this signifies that the porosity itself is three-dimensional and is situated in the entire volume of the material and not only on the surface. In the rest of the description, it will be considered that the sacrificial material and the diamond are porous, by keeping in mind that the porosity is a three-dimensional porosity, in other words that it is not situated only on the surface of the material, but that it extends in the three dimensions of the material (height, width, thickness) in other words in its volume. Moreover, as those skilled in the art will have understood, it is an open porosity, in other words that each pore communicates with the other pores, because the pores are interconnected: any pore situated inside the material is accessible from the outside of the material. In fact, the material has an open porosity over the totality of its thickness and is permeable.

The method of manufacture according to the invention thus makes it possible to obtain a porous material that is uniquely constituted of diamond (in the case where the growth of the diamond is extended up to the complete disappearance of the sacrificial material) and which may be manufactured on any substrate capable of withstanding the CVD growth of the diamond such as is known to those skilled in the art. The sacrificial material and the diamond obtained by the method of manufacture according to the invention both have a porous three-dimensional structure; the diamond layer obtained is porous and its porosity depends both on the porosity of the layer of sacrificial material and the growth time of the diamond.

It is pointed out that several methods exist for synthesising diamond by CVD growth, known to those skilled in the art, among which the methods of micro-wave enhanced chemical vapour deposition (PACVD) or radio-frequency (RF) or hot filament are the most used. The PACVD method, for example, generally consists in making diamond grains of nanometric size grow on a substrate placed in a PACVD growth reactor, operating typically at 800-1500 watts, and in a gaseous mixture comprising at least a mixture of methane (source of carbon) and hydrogen in a suitable proportion. During the growth of the diamond by the PACVD method, the temperature of the substrate is generally comprised between 400 and 900° C.

The material in which is immobilised the diamond nano-powder is known as sacrificial material, in other words that it is going to decompose during the phase of plasma enhanced CVD growth of the diamond. Preferably, said material is chosen to have the property of decomposing slowly in the diamond growth plasma up to its complete disappearance at the end of growth.

Advantageously, the sacrificial material is a polymer. Preferably, the sacrificial material is a polypyrrole. Polypyrrole is taken to mean all the polymers derived from pyrrole, in other words homopolymers comprising pyrrole units. The sacrificial material may also be poly(N-methyl pyrrole) or all homopolymers comprising N-methyl pyrrole units.

According to a variant, when the sacrificial material is a polymer, the substrate and the sacrificial material may be electrically conducting and the layer of sacrificial material present on at least one face of the substrate may be deposited by electro-polymerisation.

The sacrificial material, when it is a polymer, may also be manufactured by carrying out the chemical polymerisation of the polymer in the presence of an oxidising agent. In the case where the polymer is polypyrrole, the oxidising agent may be iron chloride.

Advantageously, the size of the diamond grains is less than or equal to 100 nm, preferably less than or equal to 15 nm.

Preferably, the diamond nano-powder is preferentially detonation powder, due to the smallness of the size of the grains thereof (5 to 15 nanometers for the primary nano-powder). Alternatively the nano-powder may also be obtained by milling of diamond powder of coarser size. The diameter of interest of the diamond nano-powder will typically be of the order of 1 to 100 nm. In both cases, the core of the nano-powder is composed to a large extent of sp3 hybridised carbon. The diamond nano-powder could be used untreated, or after purification in the case of detonation powder.

Advantageously, the porous diamond layer has a porosity occupying from 5 to 50% of the total volume of the porous diamond layer.

Advantageously, the pores of the layer of sacrificial material have a size at least 2 times larger than the size of the diamond grains that have to be incorporated in the sacrificial material. The pores of the layer of sacrificial material can thus have a size that can attain several micrometers.

The porous diamond obtained according to the method of the invention has numerous advantages.

Firstly, unlike certain materials described in the prior art, the material obtained may be composed uniquely of diamond if the growth of the diamond is continued up to the complete disappearance of the sacrificial material. In other words, it is not a composite material. Thus, all of the intrinsic properties of the diamond may be conserved.

Then, unlike the materials generally developed for their dielectric properties and having a very small pore size (conventionally comprised between 1 and 100 nm), the porosity of the material obtained according to the method of the invention may be very large, with pore sizes that can attain several micrometers, which makes it possible for example to insert therein biological cells.

Finally, unlike certain materials obtained by annealing techniques at very high temperatures or by means of an illumination laser, said diamond material may be made to grow in standard experimental conditions in a diamond growth reactor by the CVD method. It may thus be manufactured on any type of substrate that can withstand a CVD growth of diamond, which is a growth method at low temperature (in other words less than or equal to 1000° C.) and at low pressure (in other words less than or equal to 300 mbar) in a growth reactor. It may thus, for example, be carried out on glass substrates that do not withstand temperatures greater than 800° C.

In addition, in the case where the sacrificial material is polypyrrole, the use of polypyrrole presents the advantage of being able to be deposited at ambient temperature on any type of substrate compatible with the growth of the diamond by a CVD method. Moreover, the polypyrrole may be deposited by electro-polymerisation on most of the electrically conductive substrates that are conventionally used for the growth of synthetic diamond. It is thus possible to deposit the polypyrrole locally uniquely on electrically conductive structures of a substrate, to dope the polypyrrole with the diamond nano-powder (but the nano-powder may also be already present in the polypyrrole before it is deposited on the substrate), to then make a porous diamond layer grow uniquely on the conducting structures. Said method of structuring the porous diamond layer is particularly advantageous for the manufacture of diamond microelectrodes.

BRIEF DESCRIPTION OF DRAWINGS

The invention will be better understood and other advantages and particularities will become clearer on reading the description that follows, given as a non limiting example, accompanied by the appended figures among which

DETAILED DESCRIPTION OF PARTICULAR EMBODIMENTS

Figure 1:
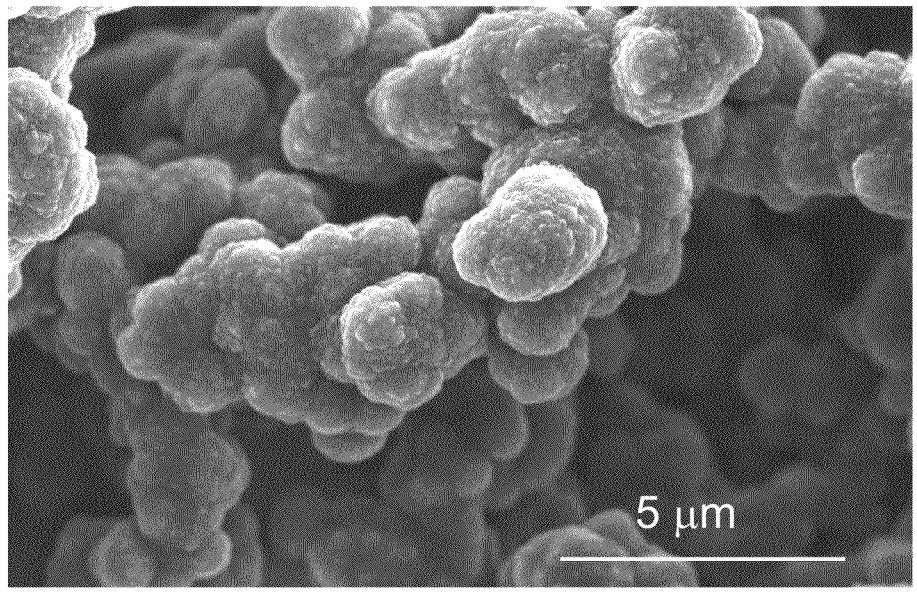
FIG. 1 and FIG. 2 are two photographs taken by means of a scanning electron microscope of a same material made of porous diamond obtained according to the method of the invention, shown according to two different scales.

It has been seen above that the sacrificial material used in the method according to the invention may be a polymer and is preferably a polypyrrole.

The polypyrrole may be manufactured either by chemical oxidation (chemical polymerisation under the action of oxidants), or by electro-polymerisation.

In the case of chemical polymerisation under the action of oxidant, the polypyrrole is obtained by mixing a solution containing a suitable quantity of pyrrole with a solution of suitable concentration of an oxidant, for example iron chloride ($FeCl_3$), which brings about the polymerisation of the polypyrrole, which then precipitates in the mixture since it is insoluble in most solvents.

The solvents used to dissolve the pyrrole and the iron chloride are either pure water, or an organic solvent, for example methanol, ethanol, or acetonitrile. In fact, the choice of the solvents is determined by the structure that it is wished to obtain for the polypyrrole. Indeed, it is known to those skilled in the art that as a function of the solvents used, the polymer thereby manufactured will have a different structure, for example a wire structure of micrometric to nanometric diameter, in the form of dendrites, etc. It is also possible to add directly the pyrrole into a solution of iron chloride or conversely, even if this is not the preferred method.

The diamond nano-powder is incorporated in the polypyrrole during or after the manufacture of the latter.

In the first case, the diamond nano-powder is dispersed by intense ultrasonication in the solution containing the pyrrole or in the solution containing the oxidant (for example iron chloride). After mixing the two solutions, which brings about the polymerisation, the diamond nano-powder is directly trapped in the polymer matrix of the polypyrrole.

In the second case, the polypyrrole manufactured as indicated above is immersed in a solution containing a dispersion of diamond nano-powder dissolved in a suitable solvent, usually water or ethanol. By virtue of its nanometric size, a sufficient quantity of diamond nano-powder is going to be trapped at the surface and in the pores of the polymer.

To obtain polypyrrole by chemical polymerisation, it is also possible to dissolve an oxidant (for example iron chloride) in a solvent having a high boiling point and viscosity. Said solvent will be for example triethylene glycol. Said solution will then be arranged on a substrate, then exposed to pyrrole vapours which are going to diffuse in the solution containing the oxidant, then polymerise under the action of the latter. After rinsing of the solvent having served to immobilise the oxidant on the surface of the substrate, a layer of porous polypyrrole is obtained on the substrate. Said layer will then be immersed, as disclosed previously, in a dispersion of diamond nano-powder in order to immobilise the latter in the polymer matrix.

In the case of an electro-polymerisation, an electrolyte solution containing the pyrrole and a background salt chosen from those generally used for the formation of polymers is used in a conventional system with three electrodes (working electrode, counter-electrode and reference electrode) in order to deposit the polymer on the working electrode, by making a current flow between the working electrode and the counter-electrode. The working electrode is in fact a substrate that is electrically conductive and which is chosen in order to be able to withstand the conditions of growth of the diamond by the CVD method. Said substrate may for example be doped silicon.

The diamond nano-powder may be incorporated in the polymer during the electro-polymerisation phase by dispersing the diamond nano-powder in the electrolyte solution by ultrasonication. Alternatively, the diamond nano-powder may be immobilised in the polymer once formed by immersing the polymer film in a dispersion of diamond nano-powder. It should be noted that the experimental conditions of electro-polymerisation of the polymer will be chosen to enable the formation of a film of polymer having a porous geometric structure thanks to a judicious choice of the background salt.

The layer of polypyrrole doped with the diamond nano-powder, prepared according to one of the methods described above, is then placed in a CVD growth reactor. Growth conditions, well known to those skilled in the art, are applied to enable the growth of the diamond grains in the polymer matrix. As the growth proceeds, the polymer is etched, to obtain at the end of the method a layer composed uniquely of diamond. The diamond layer obtained is porous and has a porosity which depends on the porosity of the sacrificial layer of polymer and the growth time of the diamond.

Two examples of forming a porous diamond support according to the invention, in which the sacrificial material is polypyrrole, will now be described.

EXAMPLE 1

A solution of methanol containing 50 mg of pyrrole in 10 mL of liquid is prepared.

In parallel, 10 mL of an aqueous solution is prepared containing 120 mg of iron chloride and in which a quantity of 0.1% by weight of diamond powder of nanometric size is dispersed by the use of ultra-sounds. The nano-powder SYNDIA® of Van Moppes, in Switzerland, having the reference 11247 is chosen; said powder has the following characteristics: 14.8 carats/kg and a "grade 0-0.02 GAF", in other words that the diamond powder is conditioned in the form of liquid diamond (it is in solution and not in dry form) and is GAF (guaranteed agglomerate free), with particles of sizes comprised between 0 and 0.02 µm.

Then, the methanol solution is poured into the aqueous solution and the solution thereby obtained is vigorously stirred for around 1 minute. Said solution is then kept at a temperature of 4° C. for 12 hours.

A black precipitate of polypyrrole doped with the diamond nano-powder is then isolated from the solution, then rinsed thoroughly in acetonitrile until a clear rinsing solution is obtained, not containing iron chloride.

The precipitate is then deposited on a silicon substrate and said substrate is then introduced into a micro-wave plasma enhanced CVD growth reactor. The growth of the diamond is carried out in the following conditions:

pressure in the reactor: 40 mbars;
proportion of gases: 99% of hydrogen and 1% of methane;
micro-wave power: 900 watts;
growth time: 5 hours;
temperature of the substrate: 800° C.

At the end of the deposition, a film of porous diamond is obtained. The diamond film has a thickness of 30 micrometers and pores, the size of which is comprised between 0.5 and 10 micrometers.

Figure 2:
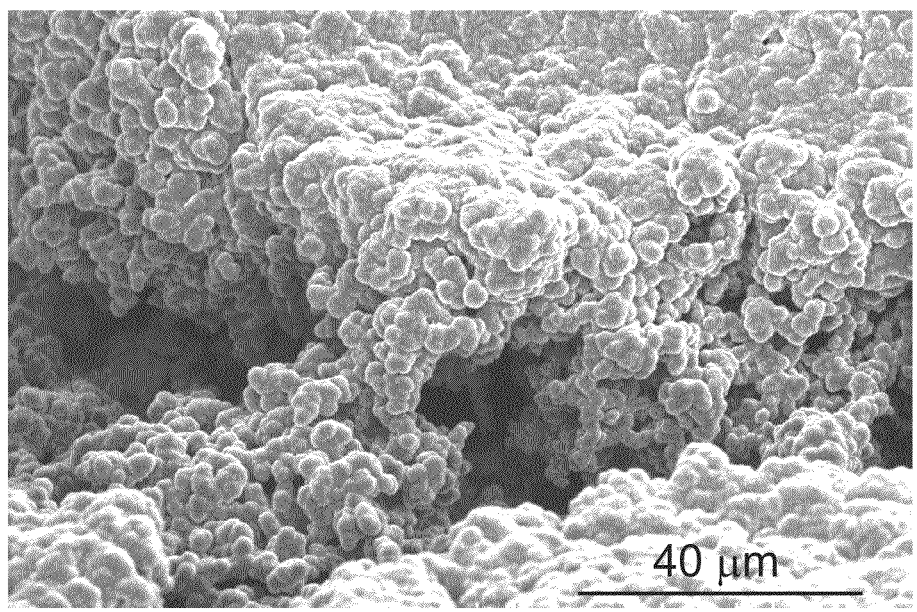

Photographs of the film thereby obtained, taken with a scanning electron microscope, may be seen in FIGS. 1 and 2. Consulting these two figures, it will be observed that the material obtained has a very porous dendritic three-dimensional structure. The discontinuity of the film observable in FIG. 2 stems from the discontinuity of the film of polypyrrole before the growth of the diamond.

EXAMPLE 2

According to a variant of the invention, polypyrrole is manufactured in the following manner.

A solution of 4 moles per liter of iron chloride dissolved in tri-ethylene glycol is deposited on a silicon substrate.

The substrate is then placed in a desiccator in which is also introduced a beaker containing 5 mL of pyrrole. Nitrogen is made to flow in the desiccator at a flow rate of 300 mL per minute and for a time of 3 hours, which corresponds to the polymerisation time.

The pyrrole vapours diffuse in the oxidising solution of iron chloride and thereby form a precipitate of polypyrrole in the solution.

The substrate is then thoroughly rinsed in acetonitrile until a clear solution is obtained without iron chloride.

The substrate is then dried in air, then immersed for 5 minutes in an ethanol solution containing 1% by weight of dispersed diamond powder of nanometric size. As in example 1, the nano-powder SYNDIA® of Van Moppes having the reference 11247 is chosen, a "grade 0-0.02 GAF" and 14.8 carats/kg.

The substrate is then dried, then introduced into a CVD growth reactor. The growth is carried out according to the experimental conditions described in example 1.

A film of porous diamond similar to that obtained in example 1 is obtained.

BIBLIOGRAPHY

[1] C. E. Nebel et al., "*Diamond nano-wires, a new approach towards next generation electrochemical gene sensor platforms*", Diamond and Related Materials, Vol. 18, Issues 5-8, (2009), pages 910-917.
[2] V. Baranauskas et al., "*Method of porous diamond deposition on porous silicon*", Applied Surface Science, Vol. 185, Issues 1-2, 28 Dec. 2001, pages 108-113.
[3] U.S. Pat. No. 6,749,931 B1.
[4] T. Kondo et al., "*Conductive diamond hollow fiber membranes*", Electrochemistry Communications, Vol. 11, Issue 8, August 2009, pages 1688-1691.
[5] H. Sakaue et al., "*Low dielectric constant porous diamond films formed by diamond nanoparticles*", Appl. Phys. Lett., 83, (2003), page 2226.
[6] US 2005/0277303 A1.
[7] US 2009/0127136 A1.
[8] U.S. Pat. No. 5,885,541.

The invention claimed is:

1. A method for manufacturing a diamond layer having a porous three-dimensional structure, the method including growing the diamond layer from a sacrificial material and gradually decomposing said sacrificial material during growth of the diamond layer, said method including the following steps:
   1) provision of a substrate supporting the plasma-enhanced chemical vapour deposition growth of the diamond layer on at least one of the faces of the substrate, the substrate comprising on said at least one face a layer made of a sacrificial material having a porous three-dimensional structure and being able to decompose progressively upon contact with said plasma, the layer of sacrificial material containing diamond grains of nanometric size;
   2) growth by plasma-enhanced chemical vapour deposition of the diamond layer from diamond grains and concomitant and gradual decomposition of the sacrificial material upon contact with said plasma.

2. The method for manufacturing according to claim 1, wherein the growth of the diamond layer is stopped when both the decomposition of the sacrificial material is complete and when the layer of diamond material has a desired porosity.

3. The method for manufacturing according to claim 1, wherein the decomposition of the sacrificial material comprises the etching of the sacrificial material by the plasma.

4. The method for manufacturing according to claim 1, wherein the sacrificial material is a polymer.

5. The method for manufacturing according to claim 4, wherein the sacrificial material is a polypyrrole.

6. The method for manufacturing according to claim 4, wherein the substrate and the sacrificial material are electrically conductive and the layer of sacrificial material present on at least one face of the substrate is deposited by electropolymerisation.

7. The method for manufacturing according to claim 1, wherein the size of the diamond grains is less than or equal to 100 nm.

8. The method for manufacturing according to claim 1, wherein the porous diamond layer has a porosity occupying from 5 to 50% of the total volume of the porous diamond layer.

9. The method for manufacturing according to claim 7, wherein the size of the diamond grains is less than or equal to 15 nm.

* * * * *